United States Patent
Trivedi et al.

(10) Patent No.: US 6,417,546 B2
(45) Date of Patent: *Jul. 9, 2002

(54) P-TYPE FET IN A CMOS WITH NITROGEN ATOMS IN THE GATE DIELECTRIC

(75) Inventors: Jigish D. Trivedi; Zhongze Wang; Rongsheng Yang, all of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/444,024

(22) Filed: Nov. 19, 1999

Related U.S. Application Data

(62) Division of application No. 09/386,076, filed on Aug. 30, 1999, now Pat. No. 6,093,661.

(51) Int. Cl.$^7$ .......................... H01L 29/94; H01L 31/62; H01L 31/113
(52) U.S. Cl. ........................................ 257/369; 257/368
(58) Field of Search ................................. 257/369, 368, 257/370, 371, 372; 438/199

(56) References Cited

U.S. PATENT DOCUMENTS

| | | |
|---|---|---|
| 4,651,406 A | 3/1987 | Shimizu et al. ............... 29/571 |
| 5,254,489 A | 10/1993 | Nakata |
| 5,464,792 A | 11/1995 | Tseng et al. |

(List continued on next page.)

FOREIGN PATENT DOCUMENTS

| | | | |
|---|---|---|---|
| JP | 06302813 A | 4/1993 | |
| JP | 02001326352 A | * 11/2001 | ............... 29/78 |
| WO | WO 96/39713 | * 12/1996 | ................. 21/314 |

OTHER PUBLICATIONS

Kuroi et al., "The Effects of Nitrogen Implantation Into P + Poly–Silicon Gate on Gate Oxide Properties", 1994 Symposium on VLSI Technology Digest of Technical Papers, pp. 107–108.

Doyle et al., "Simultaneous Growth of Different Thickness Gate Oxides in Silicon CMOS Processing", IEEE Electron Device Letters, vol. 16, No. 7.

Ko et al., "The Effect of Nitrogen Incorporation Into the Gate Oxide by Using Shallow Implantation of Nitrogen and Drive–in Process", 1998 IEEE, 0–7803–4932–6/98.

C.T. Liu et al.; "Multiple Gate Oxide Thickness for 2GHz System–on–A–Chip Technologies"; IEEE 1998; pp. 21.2.1–21.2.4.

Primary Examiner—Steven Loke
Assistant Examiner—Douglas W. Owens
(74) Attorney, Agent, or Firm—Wells St. John P.S.

(57) ABSTRACT

In accordance with an aspect of the invention, a semiconductor processing method of forming field effect transistors includes forming a first gate dielectric layer over a first area configured for forming p-type field effect transistors and a second area configured for forming n-type field effect transistors, both areas on a semiconductor substrate. The first gate dielectric layer is silicon dioxide having a nitrogen concentration of 0.1% molar to 10.0% molar within the first gate dielectric layer, the nitrogen atoms being higher in concentration within the first gate dielectric layer at one elevational location as compared to another elevational location. The first gate dielectric layer is removed from over the second area while leaving the first gate dielectric layer over the first area, and a second gate dielectric layer is formed over the second area. The second gate dielectric layer is a silicon dioxide material substantially void of nitrogen atoms. Transistor gates are formed over the first and second gate dielectric layers, and then p-type source/drain regions are formed proximate the transistor gates in the first area and n-type source/drain regions are formed proximate the transistor gates in the second area.

7 Claims, 3 Drawing Sheets

U.S. PATENT DOCUMENTS

| | | | |
|---|---|---|---|
| 5,502,009 A | 3/1996 | Lin | 437/239 |
| 5,596,218 A * | 1/1997 | Soleimani et al. | 257/369 |
| 5,620,908 A | 4/1997 | Inoh et al. | |
| 5,674,788 A * | 10/1997 | Wristers et al. | 437/239 |
| 5,716,864 A | 2/1998 | Abe | |
| 5,960,302 A * | 9/1999 | Ma et al. | 438/585 |
| 5,972,783 A | 10/1999 | Arai et al. | |
| 5,994,749 A * | 11/1999 | Oda | 257/411 |
| 6,136,654 A | 10/2000 | Kraft et al. | 438/287 |
| 6,153,538 A * | 11/2000 | An | 438/766 |
| 6,165,846 A | 12/2000 | Carns et al. | 438/264 |
| 6,200,834 B1 | 3/2001 | Bronner et al. | 438/142 |
| 6,225,151 B1 * | 5/2001 | Gardner et al. | 438/162 |

* cited by examiner

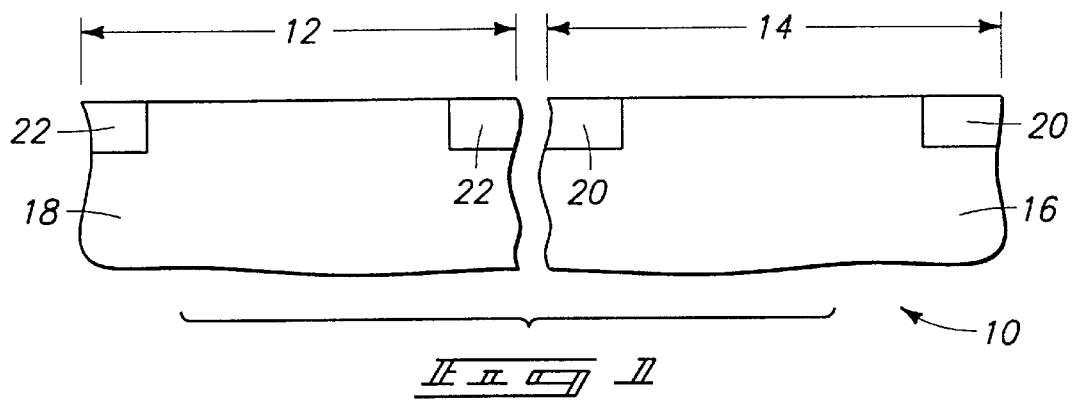
_Fig. 1_
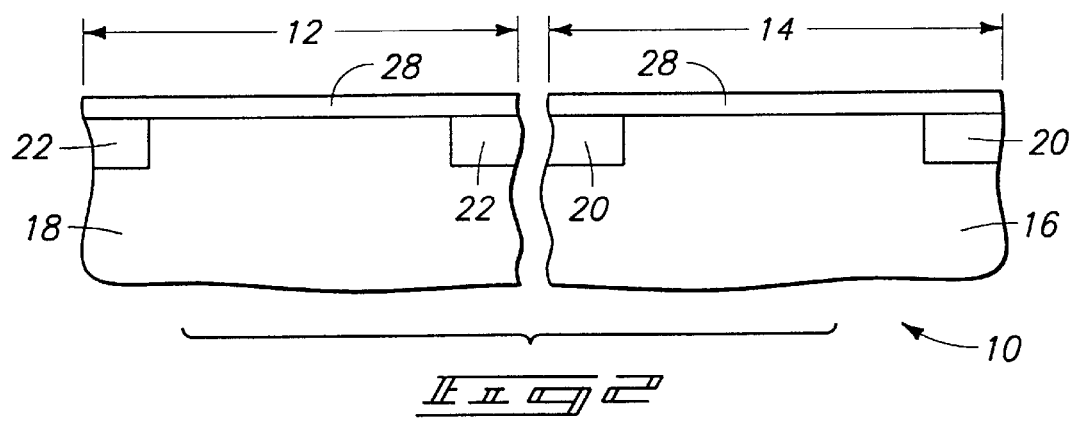
_Fig. 2_
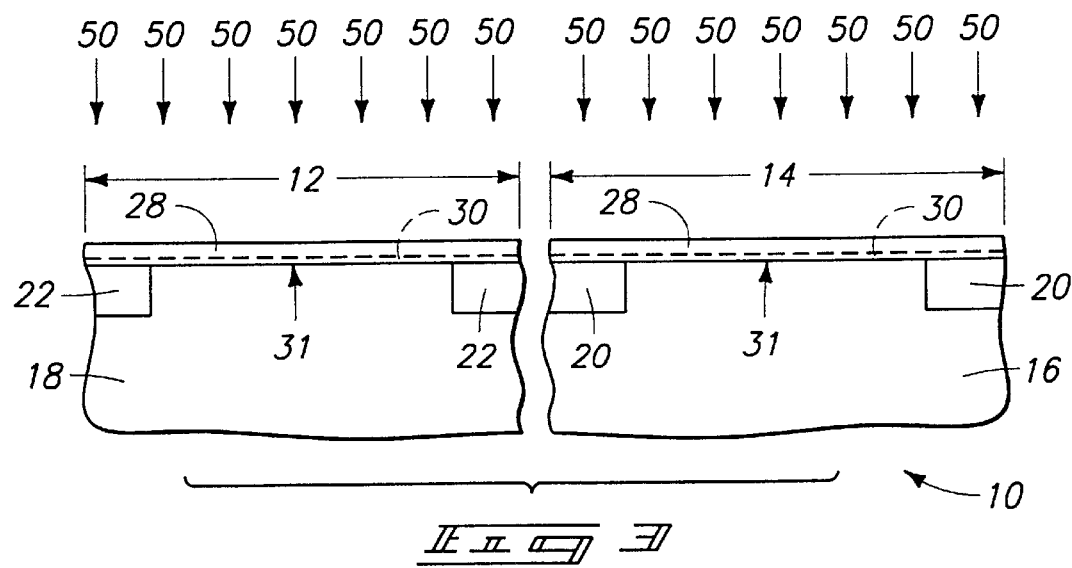
_Fig. 3_

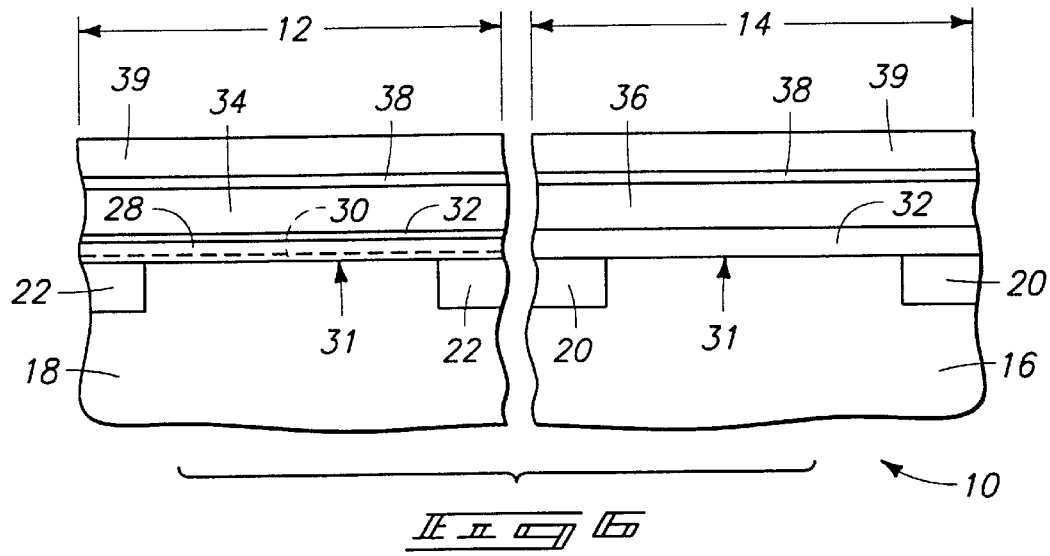
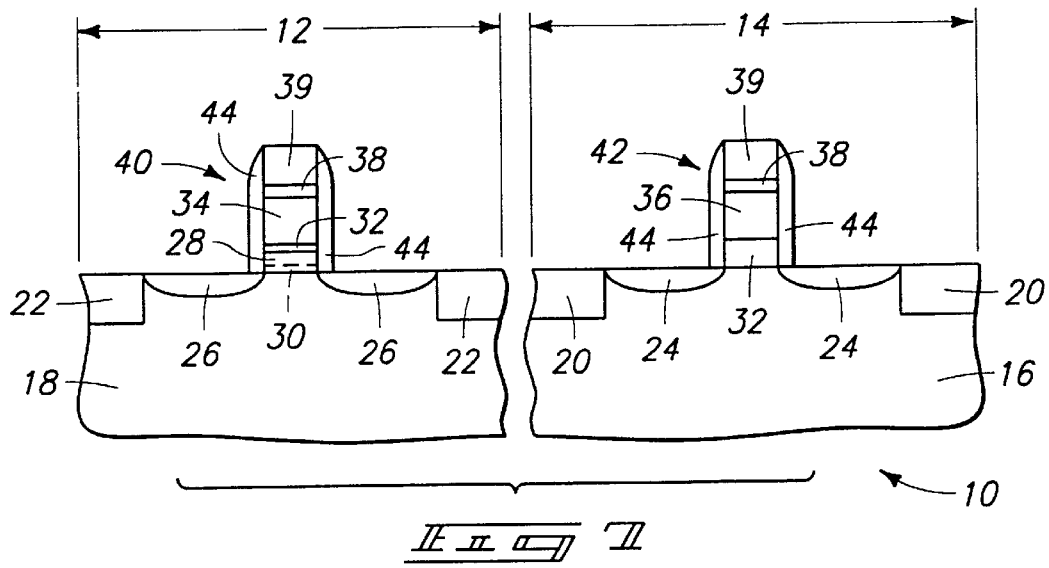

P-TYPE FET IN A CMOS WITH NITROGEN ATOMS IN THE GATE DIELECTRIC

RELATED PATENT DATA

This application resulted from divisional U.S. patent application Ser. No. 09/386,076, filed Aug. 30, 1999 now U.S. Pat No. 6,093,661, entitled "Integrated Circuitry and Semiconductor Processing Method of Forming Field Effect Transistors", naming Jigish D. Trivedi, Zhongze Wang and Rongsheng Yang as inventors, the disclosure of which is incorporated by reference.

TECHNICAL FIELD

This invention relates to methods of forming field effect transistors, and to field effect transistors and to integrated circuitry.

BACKGROUND OF THE INVENTION

Field effect transistors (FET's) are routinely included in integrated circuitry with a metal-oxide-silicon (MOS) structure. The MOSFET design comprises a pair of diffusion regions, one referred to as a source and the other a drain, each spaced apart within a semiconductive material. This design includes a gate provided adjacent to a separation region between the diffusion regions for imparting an electric field to enable current to flow between the diffusion regions. The substrate separation region adjacent the gate and between the diffusion regions is referred to as a channel. The semiconductive substrate typically comprises silicon having a light conductivity dopant concentration.

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A MOSFET structure is typically fabricated during semiconductor processing by superimposing several layers of conducting, insulating and transistor forming materials. After a series of processing steps, a typical structure might comprise levels of diffusion, polysilicon and metal that are separated by insulating layers. There are generally two types of MOSFETs, namely an n-type transistor and a p-type transistor. These transistors are fabricated within the semiconductor substrate by using either n-type doped silicon that is rich in electrons or p-type doped silicon that is rich in holes. Different dopant ions are utilized for doping the desired substrate regions with the desired concentration of holes or electrons.

The semiconductor industry continually strives to decrease the device size of components in an integrated circuit thereby increasing the overall performance speed. Accordingly, p-type and n-type field effect transistors are routinely included in integrated circuitry fabrication adjacent one another in ever closer proximities. However, as the spacing between the n-type and p-type field effect transistors on a substrate decreased, undesired effects developed. A challenge in fabrication of both transistors is to synchronize the fabrication of the paired p-type and n-type devices so that desired performance is achieved. As a result, device design, and consequently process technology, had to be modified to take these effects into account so that optimum device performance could continue to be obtained.

The gates for each transistor type are routinely fabricated from the same polysilicon layer heavily doped with an n-type material. Such s designs for p-type MOSFETs can include a p-type doped region formed within the channel region between the source/drain. However, as gate widths decrease to below 0.3 microns, this design can allow significant current leakage and increase the difficulty of designing MOSFETs with low threshold voltages to function with low power supplies. A solution is to heavily dope the p-transistor gates with p-type dopant instead of n-type dopant. However, this solution has its own problem. The p-type dopant can diffuse from the gate into the channel to cause significant current leakage between the source/drain regions.

SUMMARY OF THE INVENTION

In accordance with an aspect of the invention, a semiconductor processing method of forming field effect transistors includes forming a first gate dielectric layer over first and second areas of a semiconductor substrate. The first area is configured for forming p-type field effect transistors and the second area is configured for forming n-type field effect transistors. The first gate dielectric layer includes silicon dioxide having nitrogen atoms concentrated therein, the nitrogen atoms being higher in concentration within the first gate dielectric layer at one elevational location as compared to another elevational location. The nitrogen concentration at the one elevational location preferably ranges from 0.1% molar to 10.0% molar. The first gate dielectric layer is removed from over the second area while leaving the first gate dielectric layer over the first area. After removing the first gate dielectric, a second gate dielectric layer is formed over the second area. The second gate dielectric layer includes silicon dioxide proximate an interface of the second gate dielectric layer with the semiconductor substrate and the second gate dielectric layer is substantially void of nitrogen atoms. Next, transistor gates are formed over the first and second gate dielectric layers, and then p-type source/drain regions are formed proximate the transistor gates in the first area and n-type source/drain regions are formed proximate the transistor gates in the second area.

In another aspect of the invention, integrated circuitry includes a semiconductor substrate having an area within which a plurality of n-type and p-type field effect transistors are formed. The respective transistors include a gate, a first gate dielectric layer for the p-type transistors and a second gate dielectric layer for the n-type transistors, and source/drain regions. The first gate dielectric layer includes silicon dioxide having nitrogen atoms therein. The nitrogen atoms are higher in concentration within the first gate dielectric layer at one elevational location as compared to another elevational location. The nitrogen concentration preferably ranges from 0.1% molar to 10.0% molar. The second gate dielectric layer includes silicon dioxide material proximate an interface of the second gate dielectric layer with the semiconductor substrate which is substantially void of nitrogen atoms.

In another aspect of the invention, a semiconductor processing method of forming field effect transistors includes providing a continuous area over a semiconductor substrate for formation of n-type and p-type field effect transistors. The transistors include a gate, a gate dielectric layer and source/drain regions. A predominate portion of the gate dielectric layers of the p-type transistors are formed in the continuous area prior to forming a predominate portion of the gate dielectric layers of the n-type transistors in the continuous area.

BRIEF DESCRIPTION OF THE DRAWINGS

Preferred embodiments of the invention are described below with reference to the following accompanying drawings.

FIG. 1 is a fragmentary sectional view of a semiconductor substrate at one processing step in accordance with one embodiment of the invention.

FIG. 2 is a view of the FIG. 1 substrate fragment at a processing step subsequent to that shown in FIG. 1.

FIG. 3 is a view of the FIG. 1 substrate fragment at a processing step subsequent to that shown in FIG. 2.

FIG. 6 is a view of the FIG. 1 substrate fragment at a processing step subsequent to that shown in FIG. 5.

FIG. 7 is a view of the FIG. 1 substrate fragment at a processing step subsequent to that shown in FIG. 6.

DETAILED DESCRIPTION OF THE PREFERRED EMBODIMENTS

Figure 4:
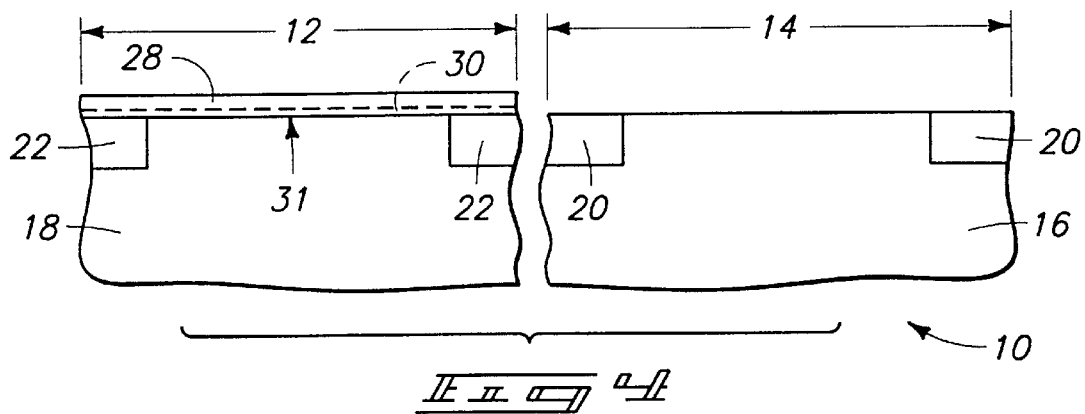
FIG. 4 is a view of the FIG. 1 substrate fragment at a processing step subsequent to that shown in FIG. 3.

This disclosure of the invention is submitted in furtherance of the constitutional purposes of the U.S. Patent Laws "to promote the Progress of Science and useful Arts" (Article 1, Section 8).

With reference to FIGS. 1–7, an embodiment of the method of the present invention is illustrated. The present invention encompasses a method of forming p-type and n-type field effect transistors on a substrate, particularly a semiconductor substrate. The semiconductor substrate includes a first area of one conductivity type region and a second area of another conductivity type region. As illustrated, the first area is a p-type region and the second area is a n-type region. While the shown embodiment has the p-type transistor in a first area, it is to be understood and described subsequently that the areas of n-type and p-type transistors shown in FIGS. 1–7 can be reversed.

Referring to FIG. 1, a semiconductor substrate fragment in process is indicated generally by reference numeral 10. A first area 12 is configured for p-type transistor fabrication and a second area 14 is configured for n-type transistor fabrication. First and second areas 12/14 may be referred to as regions, or p-type or n-type areas, or any combination thereof. Although first area 12 and second area 14 are shown as separate areas, it should be understood that the two areas can be continuous over semiconductor substrate 10. P-type region 12 includes bulk substrate material 18, preferably composed of monocrystalline silicon, and trench isolation regions 22. N-type region 14 comprises bulk substrate material 16, preferably composed of monocrystalline silicon, and trench isolation regions 20.

Referring to FIG. 2, a first gate dielectric layer 28 is formed over the p-type and n-type areas 12/14 of the semiconductor substrate 10. Such is preferably formed by a sequence of dry and wet oxidation steps. In a first step, semiconductor substrate 10 is provided in a batch six liter reactor (not shown) at 775° C., atmospheric pressure, for approximately four minutes. Oxygen is fed to the reactor at 6,000 sccm, $N_2$ at 50 sccm and a chlorine source gas at 50 sccm (i.e., trichloroethylene, trichloroethane, dichloroethylene, and anhydrous hydrogen chloride, as examples only). This preferably forms a 10 to 20 angstroms thick layer of first gate dielectric layer 28 on the semiconductor substrate 10.

Subsequently, wet processing is preferably conducted at 775° C., atmospheric pressure, for approximately 9 minutes. Oxygen is fed to the reactor at 6,000 sccm, $H_2$ at 3,000 sccm, $N_2$ at 50 sccm and a chlorine source gas at 50 sccm. The result is preferably growth of an additional 40 angstroms of layer 28. Subsequently, another "dry" processing is preferably conducted, for example, at 775° C., atmospheric pressure, for approximately 5 minutes. Example gas flows are $O_2$ at 6,000 sccm and pure $N_2$ at 1,000 sccm. The result is 10 angstroms of additional first gate dielectric layer 28. Accordingly and preferably, first gate dielectric layer 28 has been fabricated to comprise an oxide, such as silicon dioxide.

Referring to FIG. 3, an interface 31 is indicated where first gate dielectric layer 28 meets substrate material 16/18. First gate dielectric layer 28 is formed to have nitrogen atoms therein, the nitrogen atoms being higher in concentration within the first dielectric layer at one elevational location as compared to another elevational location. The nitrogen concentration could peak at any elevational location, preferably in a region 30 at a location proximate interface 31. Further preferably, the nitrogen atoms are provided to have a concentration of from 0.1% molar to 10.0% molar within region 30, and more preferably from 0.5% to 5.0% molar. An exemplary thickness for region 30 is from 30 to 60 angstroms. Processing to produce the FIG. 3 construction could be conducted in a number of different manners. For example, the semiconductor substrate 10 can be provided in a furnace (not shown) for thermal processing. An example processing is at a temperature ranging from 750° C. to 950° C., ideally 850° C., and at atmospheric pressure. A nitrogen source 50 is provided at about 100 to 10,000 sccm, ideally 1,000 sccm, for a period of from 5 minutes to 2 hours, ideally 30 minutes. The preferred sources of nitrogen have an N—O bond because of the ease of breaking the nitrogen bonds. However, other sources can be used. Examples include, in descending order of preference: NO, $N_2O$), $NH_3$, and $N_2$.

Rapid thermal processing (RTP) is another method to provide nitrogen atoms within gate dielectric layer 28. The method preferably includes providing one of the four previously listed nitrogen based compounds in a reactor. The reactor is heated to a range of from about 800° to 1200° C. at atmospheric pressure with the temperature increasing at a rate from about 10° C. per second to 200° C. per second peaking at a time range of 10 seconds to 2 minutes. Additional example alternatives to provide nitrogen atoms within gate dielectric layer 28 include nitrogen plasma treatment and nitrogen ion implant.

A preferred goal in such processing is to produce Si—N bonds at least partially along interface 31 in region 30. A preferred purpose for such region 30 is to prevent subsequent out diffusion of p-type material from a transistor gate layer into a transistor channel. Another preferred goal by provision of such nitrogen atoms is subsequent restriction of further oxidation of layer 28 as semiconductor substrate 10 is further processed, as will be described. An optional further thermal processing of semiconductor substrate 10 may be performed after forming nitrogen region 30 to re-oxidize first gate dielectric layer 28. An example re-oxidation process is at 900° C. in pure $N_2$ at 1,000 sccm, $O_2$ at 6,000 sccm, $N_2$ at 50 sccm and a chlorine source gas at 50 sccm for a period of 50 minutes.

Referring to FIG. 4, first gate dielectric layer 28 is removed from over one of the first and second areas and left over the other of the first and second areas. In the depicted and preferred example, first gate dielectric layer 28 is removed from over second area 14 and left over first area 12. Alternately, but less preferred, this could be reversed. An example process for achieving such removal comprises depositing and processing photoresist over semiconductor substrate 10 to mask p-type region 12 and leave n-type region 14 exposed. An etching process is then preferably performed to strip the first gate dielectric layer 28 from the n-type region 14. The photoresist is then removed and the semiconductor substrate 10 is preferably cleaned with a water, $H_2O_2$, and HF mix. Before removal of the photoresist, an optional channel enhancement implant can be performed in the substrate material 16 of n-type region 14 before or after stripping the first gate dielectric layer 28.

Figure 5:
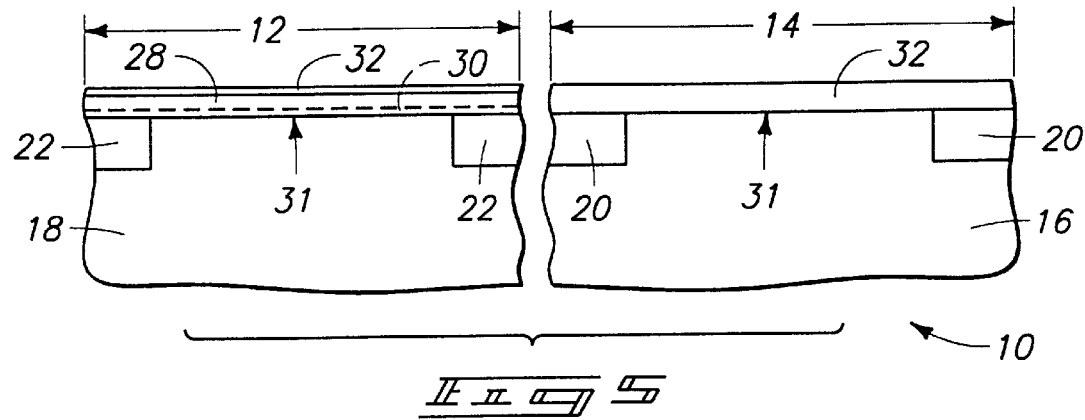
FIG. 5 is a view of the FIG. 1 substrate fragment at a processing step subsequent to that shown in FIG. 4.

Referring to FIG. 5, a second gate dielectric layer 32 is primarily formed over the other of the first and second areas 12/14. Preferably, a second gate dielectric layer 32 is formed in the same manner as previously described above for first gate dielectric layer 28 (excluding the process forming the nitrogen region 30). Accordingly, second gate dielectric layer 32 is preferably formed to comprise an oxide, such as silicon dioxide, proximate interface 31 of second gate dielectric layer 32 with semiconductor substrate material 16. Alternative methods to form second gate dielectric layer 32 include performing one or any combination of the previously described "dry" and "wet" methods for forming first dielectric layer 28.

As illustrated, the process to form second gate dielectric layer 32 preferably provides the primary layer for second gate dielectric over the n-type region 14. The thickness of second gate dielectric layer 32 can be selected or optimized for the second area 14 transistors by varying process conditions, such as temperature, pressure and processing time. Additionally, as indicated, the process can result in an additional layer over first gate dielectric layer 28, preferably less than 5 angstroms. Accordingly, first area 12 transistors and second area 14 transistors can have their gate dielectric properties separately and selectively optimized. Further, most preferably, second gate dielectric layer 32 is fabricated to be substantially void of nitrogen atoms unlike the fabrication of first gate dielectric layer 28 proximate interface 31. In the context of this document, "substantially void of nitrogen atoms" means any nitrogen atom concentration less than or equal to 0.1% molar.

Accordingly in the preferred embodiment, first gate dielectric layer 28 is different in composition relative to second gate dielectric layer 32, at least relative to nitrogen atom presence most proximate interface 31. Further, the first and second gate dielectric layers may, or may not, be different thicknesses relative to one another, depending on the chosen performance characteristics for the transistors. Further, first gate dielectric layer 28 has been formed before second gate dielectric layer 32, although such could be reversed. Further, second gate dielectric layer 32 is preferably formed to at least initially cover all of first and second areas 12/14. An alternative method of forming second gate dielectric layer 32 could be to at least initially cover only second area 14, or only a majority of second area 14.

Preferably as shown, at least a predominate portion of the gate dielectric layers of the p-type transistors are formed prior to forming a predominate portion of the gate dielectric layers for the n-type transistors. Further, the p-type transistor gate dielectric layer preferably has nitrogen atoms therein to serve as a diffusion barrier to out diffusion of p-type material from the gate into the channel region. Further, such nitrogen also preferably will function to restrict further oxide growth of layer 28 while layer 32 is being formed. The capability of selectively designing varying gate oxide thickness and gate oxide quality is ideal for semiconductor structures including, but not exclusive, high performance SRAM/LOGIC/Embedded DRAMs, and DRAM designs utilizing surface p-type devices.

Referring to FIG. 6, a gate layer 34 is provided over p-type region 12, and a gate layer 36 is provided over n-type region 14, ideally polysilicon for both. Preferably, gate layer 34 over the p-type region 12 is doped with a p-type material, preferably boron, while gate layer 36 over the n-type region 14 is doped with a n-type material. Alternatively but less preferred, layers 34 and 36 might comprise the same conductivity type dopant. A layer 38 comprising one or any combination of elemental metals, metal alloys, metal silicides and metal nitrides is formed over layers 34 and 36. An insulative layer 39 is formed over layer 38. An exemplary layer 39 comprises silicon dioxide deposited by a TEOS source.

Referring to FIG. 7, another sequence of applying photoresist, masking, and etching is preferably performed to the layers and semiconductor substrate to form gate structure 40 over the p-type region 12 and gate structure 42 over the n-type region 14. Insulative spacers 44 can be formed adjacent gate structures 40 and 42. P-type source/drain regions 26 are formed proximate the transistor gate 40 in the first area 12 and n-type source/drain regions 24 are formed proximate the transistor gate 42 in the second area 14. If desired, a silicide layer (not shown) can be formed over n-type and p-type source/drain regions 24/26.

Such constitutes but one example of forming a p-type transistor over p-type region 12 and an n-type transistor over n-type region 14. Preferably as described, only the p-type transistor includes the nitrogen concentration region 30 to act as a barrier to the boron in the heavily doped polysilicon gate.

The invention also contemplates integrated circuitry fabricated by the above and other processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising a semiconductor substrate having an area within which a plurality of n-type and p-type field effect transistors are formed, the respective transistors comprising a gate, a gate dielectric layer, a semiconductive channel region and source/drain regions, the gate dielectric layer of the p-type field effect transistors comprising an oxide having nitrogen atoms therein, and the nitrogen atoms being higher in concentration within the gate dielectric layer at only one elevational location spaced from the semiconductive channel region as compared to another elevational location elevationally below the one location, the gate dielectric layer of the n-type field effect transistors being different in composition from the gate dielectric layer of the p-type field effect transistors.

2. The integrated circuitry of claim 1 wherein the gate dielectric layer of the p-type transistors comprises silicon dioxide.

3. The integrated circuitry of claim 1 wherein the gate dielectric layer of the p-type transistors are of a different thickness relative the gate dielectric layer of the n-type transistors.

4. The integrated circuitry of claim 1 wherein the concentration of nitrogen atoms in the gate dielectric layer of the p-type transistors at the one elevational location is from 0.1% molar to 10.0% molar.

5. The integrated circuitry of claim 1 wherein the one elevational location is located proximate an interface of the gate dielectric layer with the semiconductor substrate.

6. Integrated circuitry comprising a semiconductor substrate having an area within which a plurality of n-type and p-type field effect transistors are formed, the respective transistors comprising a gate, a gate dielectric layer, a semiconductive channel region and source/drain regions, the gate dielectric layer of the p-type field effect transistors comprising silicon dioxide having nitrogen atoms therein, the nitrogen atoms being higher in concentration within the gate dielectric layer at only one elevational location spaced from the semiconductive channel region as compared to another elevational location elevationally below the one location, and the nitrogen atoms comprising a concentration of from 0.1% molar to 10.0% molar at the one location, the gate dielectric layer of the n-type field effect transistors comprising silicon dioxide material proximate an interface of the gate dielectric layer with the semiconductor substrate which is substantially void of nitrogen atoms.

7. The integrated circuitry of claim 6 wherein the one elevational location is located proximate an interface of the gate dielectric layer with the semiconductor substrate.

* * * * *

UNITED STATES PATENT AND TRADEMARK OFFICE
CERTIFICATE OF CORRECTION

PATENT NO.    : 6,417,546 B2
DATED         : July 9, 2002
INVENTOR(S)   : Jigish D. Trivedi et al.

It is certified that error appears in the above-identified patent and that said Letters Patent is hereby corrected as shown below:

Column 2,
Line 5, replace "n-type material. Such s designs for p-type" with
-- n-type material. Such designs for p-type --

Column 4,
Line 42, replace "descending order of preference: NO, $N_2O$), $NH_3$," with
-- descending order of preference: NO, $N_2O$, $NH_3$, --

Signed and Sealed this

Fourth Day of March, 2003

JAMES E. ROGAN
*Director of the United States Patent and Trademark Office*